(12) United States Patent
Akkermans et al.

(10) Patent No.: US 10,061,213 B2
(45) Date of Patent: Aug. 28, 2018

(54) SENSOR, OBJECT POSITIONING SYSTEM, LITHOGRAPHIC APPARATUS AND DEVICE MANUFACTURING METHOD

(71) Applicant: ASML NETHERLANDS B.V., Veldhoven (NL)

(72) Inventors: Johannes Antonius Gerardus Akkermans, Waalre (NL); Ruud Antonius Catharina Maria Beerens, Roggel (NL); Sander Christiaan Broers, Weert (NL); Jeroen Johannes Theodorus Hendrikus De Best, Druten (NL); Adrianus Marinus Wouter Heeren, St. Willebrord (NL); George Alois Leonie Leenknegt, Waalre (NL); Bo Lenssen, Belfeld (NL); Hendrikus Johannes Schellens, Bergeijk (NL); Peter Van Der Krieken, Boekel (NL); Theodorus Petrus Maria Cadee, Asten (NL); Jan Van Eijk, Eindhoven (NL); Richard Henricus Adrianus Van Lieshout, Batenburg (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/505,885

(22) PCT Filed: Jul. 20, 2015

(86) PCT No.: PCT/EP2015/066519
§ 371 (c)(1),
(2) Date: Feb. 22, 2017

(87) PCT Pub. No.: WO2016/034320
PCT Pub. Date: Mar. 10, 2016

(65) Prior Publication Data
US 2017/0277042 A1  Sep. 28, 2017

(30) Foreign Application Priority Data

Sep. 2, 2014  (EP) .................................. 14183218

(51) Int. Cl.
 *G03F 7/20*  (2006.01)
 *G01L 1/16*  (2006.01)
 *G01P 15/09*  (2006.01)

(52) U.S. Cl.
CPC ............ *G03F 7/70775* (2013.01); *G01L 1/16* (2013.01); *G01P 15/0915* (2013.01)

(58) Field of Classification Search
CPC .. B06B 1/0611; F16F 15/005; G03F 7/70191; G03F 7/70825; G03F 7/70258;
(Continued)

(56) References Cited

U.S. PATENT DOCUMENTS 5,824,904 A * 10/1998 Kouhei ............... G01P 15/0915
                                                                  73/514.34
9,360,774 B2    6/2016 Spruit et al.
(Continued)

FOREIGN PATENT DOCUMENTS

DE    102 60 087    7/2004
EP    0 855 034     7/1998
(Continued)

OTHER PUBLICATIONS

International Search Report and Written Opinion dated Oct. 27, 2015 in corresponding International Patent Application No. PCT/EP2015/066519.
(Continued)

*Primary Examiner* — Michelle M Iacoletti
(74) *Attorney, Agent, or Firm* — Pillsbury Winthrop Shaw Pittman LLP

(57) ABSTRACT

A sensor includes two shear-mode piezoelectric transducers, wherein each piezoelectric transducer has a bottom surface
(Continued)

and a top surface, wherein the top surfaces of the piezoelectric transducers are rigidly connected to each other, and wherein the bottom surfaces of the piezoelectric transducers are configured to be attached to an object to be measured.

20 Claims, 5 Drawing Sheets

(58) Field of Classification Search
CPC ............ G03F 7/70691; G03F 7/70783; G03F 7/70833; G03F 7/709; G03F 7/70516; G03F 7/70716; G03F 7/70725; G03F 7/70775; G03F 7/7085; B60G 2600/182; E04B 1/985; G01L 1/16; G01L 15/167; G02B 7/005; G01M 7/025; G01P 15/09; G01P 15/0915; G01P 15/123
See application file for complete search history.

(56) References Cited

U.S. PATENT DOCUMENTS

| | | | |
|---|---|---|---|
| 2003/0159517 A1 | 8/2003 | Ito | |
| 2004/0164253 A1 | 8/2004 | Ito | |
| 2008/0212054 A1* | 9/2008 | Kamidi | G03F 7/70725 355/53 |
| 2013/0162963 A1 | 6/2013 | Spruit et al. | |
| 2014/0078487 A1 | 3/2014 | Aubele et al. | |
| 2016/0320899 A1* | 11/2016 | Watazu | G06F 3/047 |

FOREIGN PATENT DOCUMENTS

| | | |
|---|---|---|
| JP | 62-153765 | 7/1987 |
| JP | H07-016168 | 3/1995 |
| JP | 07-253441 | 10/1995 |
| JP | 2001-074767 | 3/2001 |
| JP | 2001-083175 | 3/2001 |
| JP | 2002-084008 | 3/2002 |
| JP | 2002-162408 | 6/2002 |
| JP | 2004-153122 | 5/2004 |
| JP | 2006-032788 | 2/2006 |
| JP | 2007-035780 | 2/2007 |
| JP | 2012-173079 | 9/2012 |
| JP | 2014-517525 | 7/2014 |

OTHER PUBLICATIONS

International Preliminary Report on Patentability dated Mar. 16, 2017 in corresponding International Patent Application No. PCT/EP2015/066519.

Japanese Office Action dated Dec. 8, 2017 in corresponding Japanese Patent Application No. 2017-508996.

Notice of Reasons for Rejection issued in corresponding Japanese Patent Application No. 2017-508996, dated Jun. 13, 2018.

* cited by examiner

SENSOR, OBJECT POSITIONING SYSTEM, LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2015/066519, which was filed on Jul. 20, 2015, which claims the benefit of priority of European patent application no. 14183218.8, which was filed on Sep. 2, 2014 and which is incorporated herein in its entirety by reference.

BACKGROUND

Field of the Invention

The present invention relates to a sensor. The present invention further relates to an object positioning method, a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Recent developments in lithography push the demands of the lithographic apparatus further and further, especially with respect to the positioning of different objects, such as support structures constructed to support patterning devices, substrate tables constructed to hold a substrate, and lenses in the projection system. The positioning usually needs to be done fast and accurate, where increasing the accelerations for increased speed results in larger deformations of the objects to be positioned. These deformations have a negative impact on the position accuracy. A solution is to measure the internal deformation of the object by adding position sensors measuring the position of different locations on the object relative to a reference, but as an alternative it is possible to add strain or acceleration sensors to different locations on the object. However, current strain and acceleration sensors do not have the desired resolution and/or are too sensitive to temperature and/or electromagnetic interference.

SUMMARY

It is desirable to provide a improved strain or acceleration sensor, in particular a sensor with an improved resolution and/or a reduced sensitivity to temperature and/or electromagnetic interference.

According to an embodiment of the invention, there is provided a sensor comprising two shear-mode piezoelectric transducers, wherein each piezoelectric transducer comprises a bottom surface and a top surface, wherein the top surfaces of the piezoelectric transducers are rigidly connected to each other, wherein the bottom surfaces are configured to be attached to an object to be measured, wherein the two shear-mode piezoelectric transducers comprise a stack of at least two shear-mode piezoelectric subtransducers arranged between the respective top and bottom surface, wherein adjacent subtransducers have an opposite polarization so that a varying electromagnetic field has an opposite effect in the adjacent subtransducers.

According to a further embodiment of the invention, there is provided a sensor comprising two shear-mode piezoelectric transducers, wherein each piezoelectric transducer comprises a bottom surface and a top surface, wherein the top surfaces of the piezoelectric transducers are rigidly connected to each other, and wherein the bottom surfaces are configured to be attached to an object to be measured, and read-out electronics to read-out the internal generation of electric charge resulting from shearing of the piezoelectric transducers, wherein the read-out electronics are positioned close to the respective piezoelectric transducers.

According to another embodiment of the invention, there is provided a sensor comprising two shear-mode piezoelectric transducers, wherein each piezoelectric transducer comprises a bottom surface and a top surface, wherein the top surfaces of the piezoelectric transducers are rigidly connected to each other, and wherein the bottom surfaces are configured to be attached to an object to be measured, and read-out electronics to read-out the internal generation of electric charge resulting from shearing of the piezoelectric transducers, wherein the read-out electronics comprise a charge amplifier with a feedback circuit including a resistor and a capacitor in a parallel arrangement, wherein the resistor value is chosen relatively high.

According to yet another embodiment of the invention, there is provided a sensor comprising two shear-mode piezoelectric transducers, wherein each piezoelectric transducer comprises a bottom surface and a top surface, wherein the top surfaces of the piezoelectric transducers are rigidly connected to each other, and wherein the bottom surfaces are configured to be attached to an object to be measured, and wherein the top surfaces of the piezoelectric transducers are rigidly connected together by a beam comprising a cross section seen in longitudinal direction of the beam having a substantially rectangular shape with one or more protrusions or legs extending therefrom for additional stiffness.

According to a further embodiment of the invention, there is provided a sensor comprising two shear-mode piezoelectric transducers, wherein each piezoelectric transducer comprises a bottom surface and a top surface, wherein the top surfaces of the piezoelectric transducers are rigidly connected to each other, and wherein the bottom surfaces are configured to be attached to an object to be measured, wherein the top surfaces of the piezoelectric transducers are rigidly connected together by a beam made of a material with a relatively low coefficient of thermal expansion.

According to another embodiment of the invention, there is provided an object positioning system comprising:

an object to be positioned;

a measurement system for determining the position of the object in one or more degrees of freedom relative to a reference;

an actuator system for positioning the object;

a control system configured to drive the actuator system in dependency of an output of the measurement system, wherein the measurement system comprises one or more sensors according to the invention. According to yet another embodiment of the invention, there is provided a lithographic apparatus comprising an object positioning system according to the invention.

According to yet another embodiment of the invention, there is provided a device manufacturing method wherein use is made of an object positioning system according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
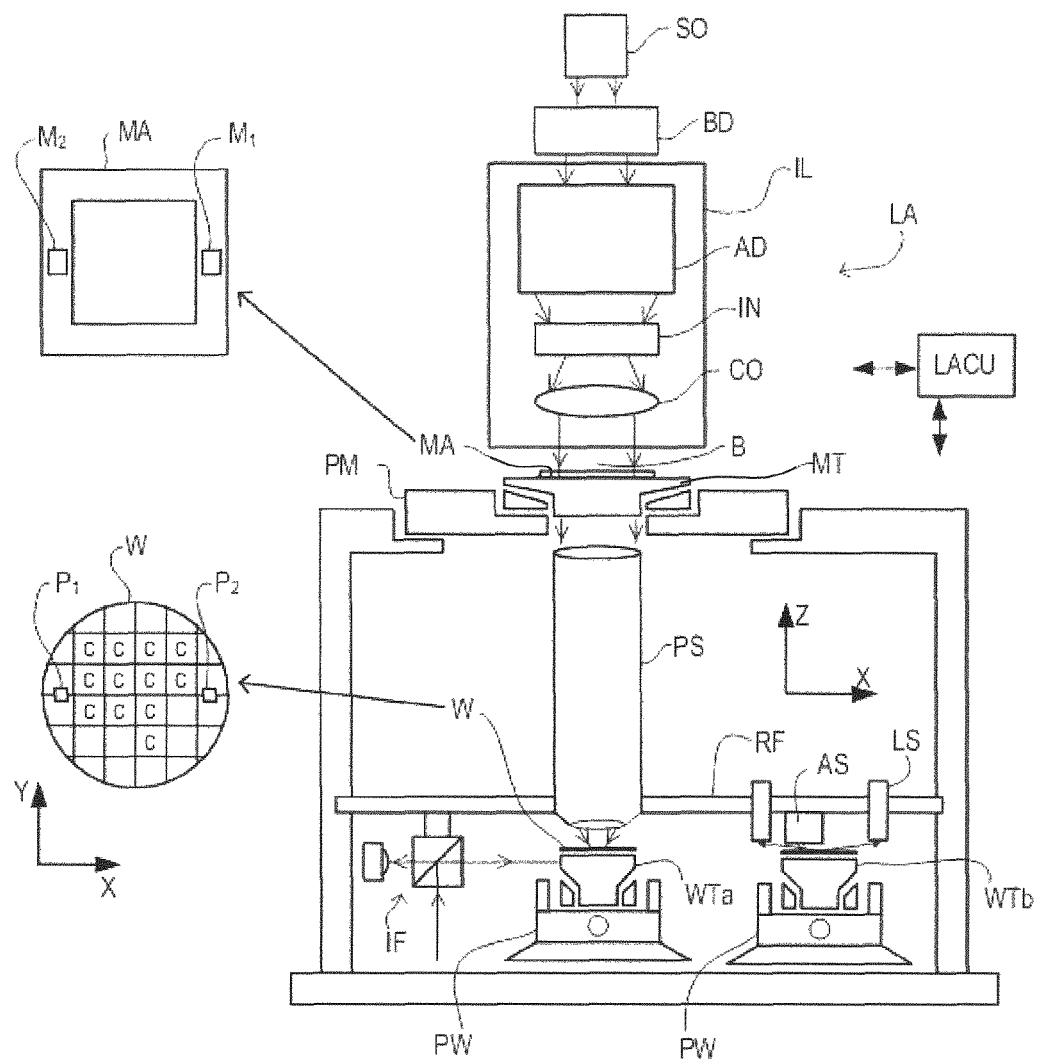
FIG. 1 depicts a lithographic apparatus according to an embodiment of the invention.

FIG. 1 schematically depicts a lithographic apparatus LA according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device MA" used herein should be broadly interpreted as referring to any device that can be used to impart a radiation beam with a pattern in its cross-section such as to create a pattern in a target portion C of the substrate W. It should be noted that the pattern imparted to the radiation beam may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system PS" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables) or one substrate table and one calibration stage. In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses. In an embodiment, the lithographic apparatus has a measurement table instead of one of the two substrate tables WTa and WTb. Alternatively, the lithographic apparatus has the measurement table in addition to the two substrate tables WTa and WTb. The measurement table is arranged to hold measurement equipment, such as a sensor to measure a property of the radiation beam, but is not configured to hold a substrate W.

The lithographic apparatus LA may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus LA, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus LA may be separate entities, for example when the radiation source SO is an excimer laser. In such cases, the radiation source SO is not considered to form part of the lithographic apparatus LA and the radiation beam is passed from the radiation source SO to the illuminator IL with the aid of a beam delivery system BD comprising, for example, suitable directing mirrors and/or a beam expander. In other cases the radiation source SO may be an integral part of the lithographic apparatus LA, for example when the radiation source SO is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WTa/WTb are kept essentially stationary, while an entire pattern imparted to the radiation beam B is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WTa/WTb are scanned synchronously while a pattern imparted to the radiation beam B is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device MA, and the substrate table WTa/WTb is moved or scanned while a pattern imparted to the radiation beam B is projected onto a target portion C. In this mode, generally a pulsed radiation source SO is employed and the programmable patterning device MA is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The lithographic apparatus LA further includes a control unit LACU which controls all the movements and measurements of the various actuators and sensors described. Control unit LACU also includes signal processing and data processing capacity to implement desired calculations relevant to the operation of the lithographic apparatus LA. In practice, control unit LACU will be realized as a system of many sub-units, each handling the real-time data acquisition, processing and control of a subsystem or component within the lithographic apparatus LA. For example, one processing subsystem may be dedicated to servo control of the substrate positioner PW. Separate units may even handle coarse and fine actuators, or different axes. Another unit might be dedicated to the readout of the position sensor IF. Overall control of the lithographic apparatus LA may be controlled by a central processing unit, communicating with these sub-systems processing units, with operators and with other apparatuses involved in the lithographic manufacturing process. As described above, the support structure MT and the substrate table WTa/WTb are examples of objects within the lithographic apparatus LA that may need to be positioned (accurately) relative to a reference, e.g. the projection system PS. Other examples of objects that may be positionable are optical elements in the projection system PS.

In order to position objects relative to a reference within the lithographic apparatus LA, the lithographic apparatus LA comprises one or more object positioning systems according to the invention, which will be described in more detail below. Although in the remainder of this description the general term "object" will be used, it will be apparent that this term can be replaced by substrate table WT, support structure MT, optical element, projection system PS, etc., where applicable.

Figure 2:
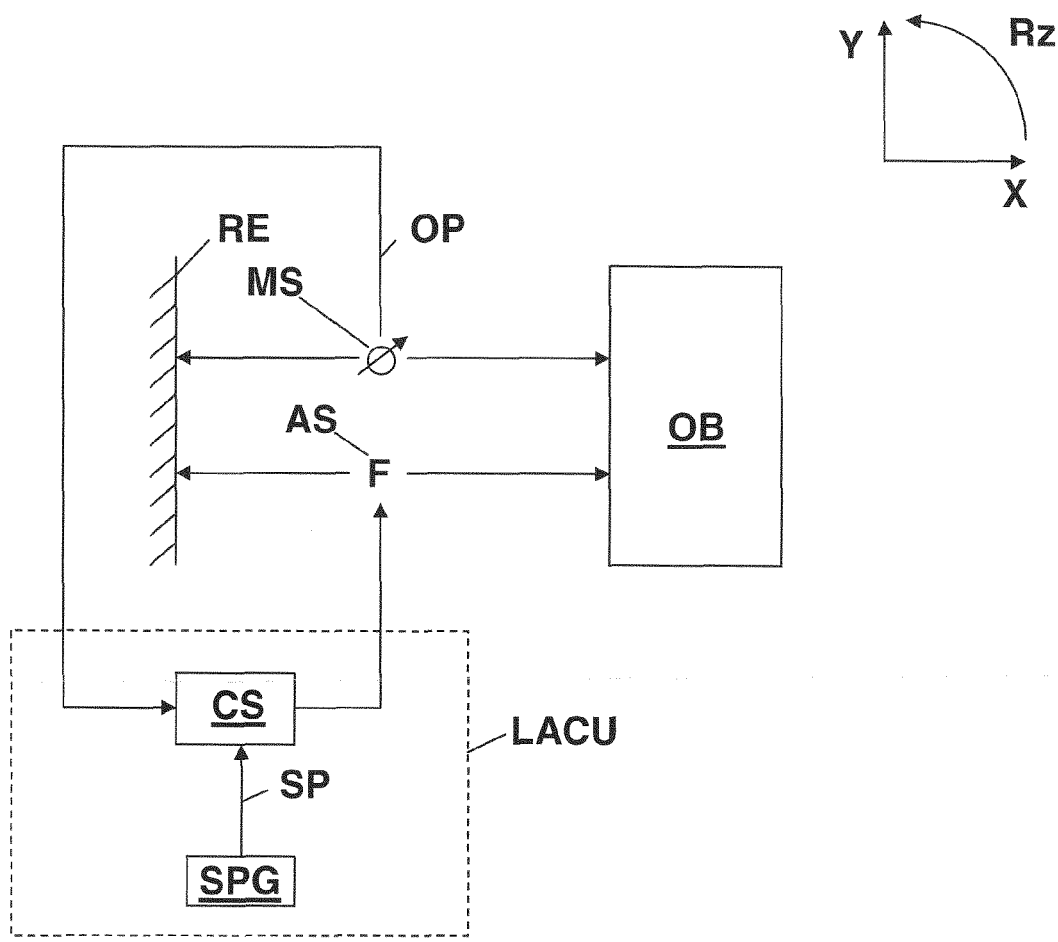
FIG. 2 depicts schematically an object positioning system according to an embodiment of the invention.

An object positioning system according to the invention is schematically depicted in FIG. 2 and comprises:
  an object OB, e.g. a substrate table WT or support structure MT as shown in FIG. 1, to be positioned relative to a reference RE, e.g. a projection system PS;
  a measurement system MS for measuring the position of the object in one or more degrees of freedom, e.g. translational directions X,Y or rotational direction Rz, relative to the reference RE;
  an actuator system AS with one or more actuators for positioning the object OB, preferably by applying a force F to the object OB; and
  a control system CS configured to drive the actuator system AS in dependency of an output OP of the measurement system MS and a set-point SP representing a desired position of the object OB.

In FIG. 2 the actuator system AS is shown as applying a force F between the object OB and the reference RE, however, it is not necessary per se that the force is applied to the reference RE. In order to minimize disturbances as a result of the applied forces a so-called separate force frame may be provided which is uncoupled from the reference RE allowing to apply forces F to the object without disturbing the reference RE which is used by the measurement system MS to determine the position of the object relative to the reference RE.

In FIG. 2 the measurement system MS is shown as measuring the position of the object OB relative to the reference RE. Although this figure may suggest that a direct measurement is performed, it is also possible that the measurement system is configured to measure the position of the object relative to another structure. The measurement system MS is considered to measure the position of the object in one or more degrees of freedom relative to the reference RE as long as this position can be deducted from the output OP of the measurement system MS. Examples of degrees of freedom which can be measured by the measurement system MS are a X-direction, a Y-direction perpendicular to the X-direction, and a rotational direction Rz about an axis perpendicular to both the X- and Y-direction, commonly referred to as the Z-direction. Other degrees of freedom, such as the Z-direction and/or rotational directions about the X-direction and the Y-direction are also envisaged. Hence, it is not limited to a plane.

The set-point SP may be provided to the control system CS by a set-point generator SPG. Both the set-point generator and the control system CS may be part of a control unit LACU as also depicted in FIG. 1.

Figure 3:
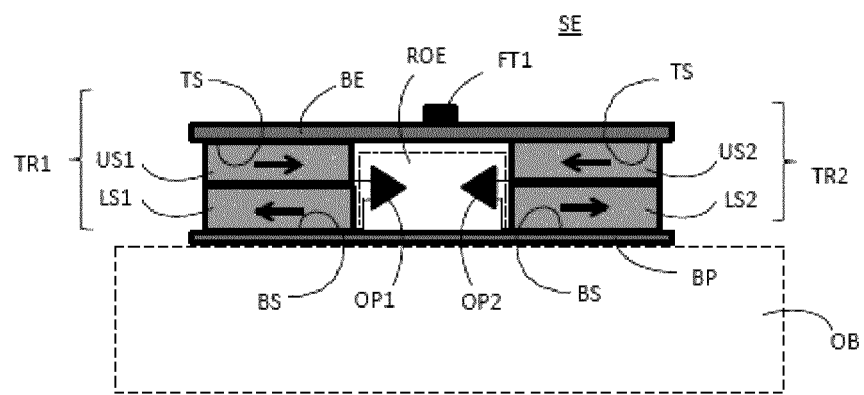
FIG. 3 depicts schematically an embodiment of a sensor according to the invention.

The measurement system of FIG. 2 comprises a sensor SE as schematically depicted in FIG. 3. The sensor SE comprises a first shear-mode piezoelectric transducer TR1 and a second shear-mode piezoelectric transducer TR2. The first and second transducer each comprise a respective bottom surface BS and a top surface TS, wherein the top surfaces TS of the first and second transducers TR1, TR2 are rigidly connected to each other via a beam BE. The bottom surfaces BS of the first and second transducers TR1, TR2 are configured to be attached to an object OB to be measured via a bottom plate BP. It is noted here that the bottom plate may not be needed if the transducers TR1, TR2 can be directly attached, e.g., glued, to the object OB. The shear-mode piezoelectric transducers TR1 and TR2 are subjected to a shear force when strain occurs in the object at the location where the sensor is attached to the object. The shear-mode piezoelectric transducers TR1 and TR2 are further subjected to a shear force when the object OB is being accelerated. Hence, this type of sensor SE can be used as a strain sensor and an acceleration sensor as will be explained in more detail below.

The first transducer TR1 comprises, in this example, a stack of two shear-mode piezoelectric subtransducers, namely an upper subtransducer US1 and lower subtransducer LS1. The polarization of the upper substransducer US1 is opposite to the polarization of the lower subtransducer LS1 in the same stack, as indicated by the direction of the arrows depicted in the respective subtransducers US1 and LS1, so that a varying electromagnetic field has an opposite effect in the adjacent subtransducers US1 and LS1.

The second transducer TR2 also comprises, in this example, a stack of two shear-mode piezoelectric subtransducers, namely an upper subtransducer US2 and lower subtransducer LS2. The polarization of the upper substransducer US2 is opposite to the polarization of the lower subtransducer LS2 in the same stack, as indicated by the direction of the arrows depicted in the respective subtransducers US2 and LS2, so that a varying electromagnetic field has an opposite effect in the adjacent subtransducers US2 and LS2.

As a result of this configuration of the stacks with opposite polarization of the subtransducers, signals induced in the subtransducers due to varying electromagnetic fields, also referred to as electromagnetic interference, substantially cancel out, so that the sensitivity for electromagnetic interference is reduced. This is especially advantageous when the sensor is placed near an electromagnetic actuator generating relatively large varying electromagnetic fields.

Although the example in FIG. 3 discloses stacks of two subtransducers, stacks of more than two subtransducers are also envisaged. Adjacent subtransducers forming a single stack have opposite polarizations. Using more subtransducers in a stack further reduces the electromagnetic interference as the influence of a varying electromagnetic field with a gradient along the stack is reduced. In a preferred embodiment, the number of subtransducers is even. An even number of subtransducers has the advantage that each subtransducer has a counterpart in the same stack to cancel out the signals induced by the electromagnetic field. In the embodiment of FIG. 3, the upper and lower subtransducers may be electrically connected in parallel to each other, but other connection schemes are also envisaged depending on the read-out electronics.

Figure 4:
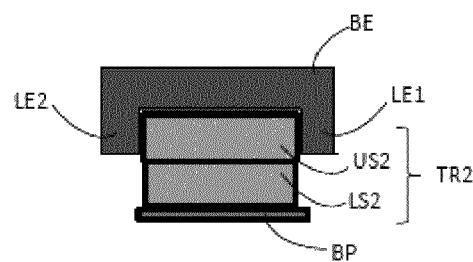
FIG. 4 depicts a side view of the sensor of FIG. 3.

The beam BE rigidly connecting the top surfaces TS of the transducers TR1, TR2 may have a rectangular cross section seen in longitudinal direction of the beam BE, but in case of high-bandwidth applications, the stiffness of the beam may be further increased by adding one or more protrusions or legs extending from the rectangular cross section. An example thereof is shown in FIG. 4, in which a side view of the sensor SE of FIG. 3 is depicted. FIG. 4 only depicts the beam BE, the piezoelectric transducers TR2 with subtransducers US2 and LS2 and bottom plate BP. Other components have been omitted in FIG. 3 for simplicity reasons.

In FIG. 4 it can be clearly seen that the beam BE has a substantially rectangular cross section with a first leg LE1 and a second leg LE2 extending therefrom for additional stiffness. The result is a U-shape upside-down. Other configuration, such as an upright U-shape and a H-shape are also envisaged.

In an embodiment, the beam BE is made of a material with a relatively low coefficient of thermal expansion (CTE), for instance a lithium aluminsilicate glass-ceramic as zerodur, invar or cordierite. In an embodiment, the bottom plate BP is made from the same material as the beam BE. In another embodiment, the bottom plate BP and the beam BE are made of the same material as the object to which they are to be connected.

Thermal expansion of the beam BE relative to the object OB may also cause the first and second shear-mode piezoelectric transducers to be subjected to a shear force, so that a thermal expansion may result in an undesired deviation of the sensor signal. The use of a material with a low CTE ensures that the thermal expansion due to a temperature difference is small. The use of the same materials for object and sensor has the advantage that in case some thermal expansion occurs due to a homogeneous temperature increase, the thermal expansion of the beam BE is substantially equal to the expansion in the object itself, so that the thermal expansion does not introduce a shear force in the transducers TR1, TR2.

Referring back to FIG. 3, the sensor SE further comprises read-out electronics ROE to read-out the internal generation of electric charge resulting from shearing of the piezoelectric transducers TR1, TR2, wherein the read-out electronics are positioned close to the respective transducers, in this case by positioning them in between the two transducers TR1, TR2. This reduces the length of the wires connecting the transducers to the read-out electronics so that the sensitivity to electromagnetic interference is further reduced.

Figure 5:
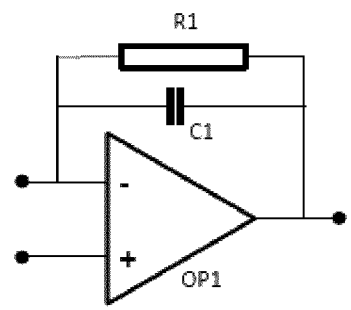
FIG. 5 depicts an amplifier circuit for use in a sensor according to the invention.

The read-out electronics comprise a charge amplifier OP1, OP2 per transducer TR1, TR2 as schematically depicted in FIG. 3 and in more detail in FIG. 5. FIG. 5 depicts an amplifier circuit with a charge amplifier OP1/OP2 that has as input two leads from the respective transducers TR1, TR2. The amplifier circuit further comprises a feedback circuit with in parallel a resistor R1 and a capacitor C1. In order to not further obscure the drawing of FIG. 5, only part of the read-out electronics is shown. To improve the low-frequency behavior of the amplifier circuit, the resistor R1 is chooses to be relatively high, for instance 1 TOhm.

Figure 6A:
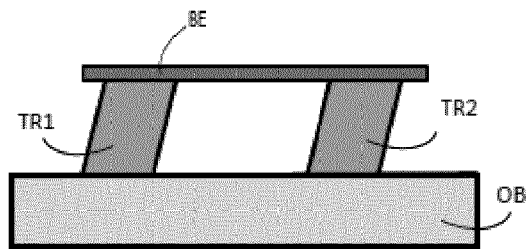
FIG. 6A depicts a first deformation mode of the sensor of FIG. 3.

Referring back to FIG. 3, the sensor further comprises a first temperature sensor FT1 on the beam BE and a second temperature sensor FT2 in between the first and second transducers TR1, TR2. This allows the sensor to measure the temperature of the beam BE and e.g. to compensate (for example, in the processing of the signals from the by the charge amplifiers OP1 and OP2 in the read-out electronics) for thermal expansion due to temperature changes, and to measure the temperature at or near the electronics which may allow to measure whether there is a temperature gradient across the sensor and to compensate for that (for example, in the read-out electronics). FIG. 6A depicts a first deformation mode of the sensor of FIG. 3. Shown in FIG. 6A are the object OB to which the sensor is attached, the first and second transducers TR1, TR2 and the beam BE connecting the first and second transducers. In FIG. 6A, the object is accelerated to the left, so that both the first and second transducers shear in the same direction, namely to the right due to the inertia of the beam BE. The opposite applies for acceleration to the right.

Figure 6B:
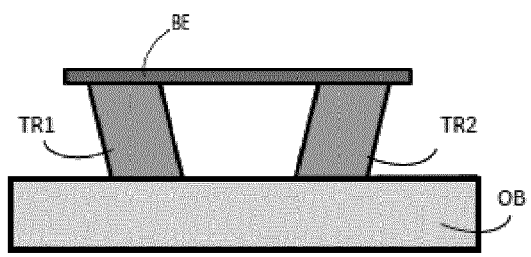
FIG. 6B depicts a second deformation mode of the sensor of FIG. 3.

FIG. 6B depicts a second deformation mode of the sensor of FIG. 3. FIG. 6B also shows the object OB to which the sensor is attached, the first and second transducers TR1, TR2 and the beam BE connecting the first and second transducers. In FIG. 6B, the object OB is compressed thereby causing the first and second transducers to shear in opposite directions. Shearing in opposite directions also occurs when the object OB undergoes an expansion.

Signal processing of the outputs of the respective charge amplifier circuits of the first and second transducers will determine whether the sensor output is sensitive to strain and/or acceleration. In case the first and second transducers are identical in configuration and polarization, the output of the amplifier circuits is the same for the first and second transducers in the first deformation mode and opposite in the second deformation mode. In that case the sensor can be made insensitive to acceleration and sensitive to strain by subtracting the outputs from each other.

However, e.g. in case the polarization is opposite, the voltage output of the transducers is the same for the second deformation mode and opposite in the first deformation mode. In that case the sensor can be made insensitive to acceleration and sensitive to strain by adding the outputs from each other.

Of course, in both cases, the opposite operation applies to making the sensor sensitive to acceleration and insensitive to strain.

Figure 7A:
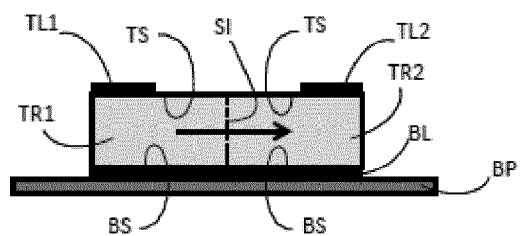
FIG. 7A depicts another embodiment of a sensor according to the invention in undeformed state.

FIG. 7A depicts another embodiment of a sensor SE according to the invention. In this embodiment, the sensor comprises a single shear-mode piezoelectric transducer TR which is formed by a first piezoelectric transducer TR1 and a second piezoelectric transducer TR2, each comprising a top surface TS, a bottom surface BS and a side surface SI, wherein the top surfaces TS of the first and second transducer are connected to each other by connecting the side surfaces SI to each other. To connect the first and second transducers to read-out electronics, the first and second transducers comprise a bottom electrode BL common to both the first and second transducers, a top electrode TL1 associated with the first transducer and a top electrode TL2 associated with the second transducer.

The transducer TR is attached to a bottom plate BP to connect the sensor to an object.

Figure 7B:
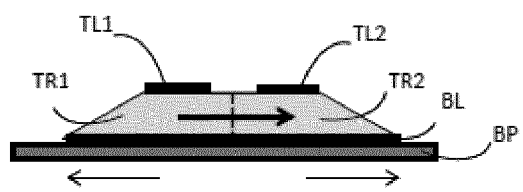
FIG. 7B depicts the sensor of FIG. 7A in a first deformation mode.

FIG. 7B depicts the sensor SE of FIG. 7A in a first deformed mode when expansion occurs in the object as indicated by the opposite arrows below the bottom plate BP.

Figure 8:
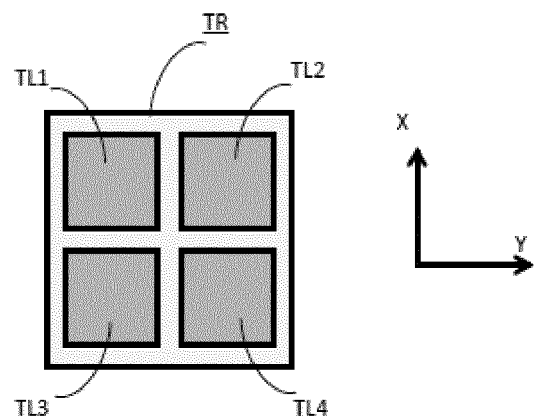
FIG. 8 depicts a further embodiment of a sensor according to the invention.

FIG. 8 depicts a top view of a sensor according to a further embodiment of the invention. The configuration is similar to the embodiment of FIGS. 7A and 7B in that the transducers forming the single transducer TR are connected to each other via their side surfaces. Where the embodiment in FIGS. 7A and 7B has only two transducers, the embodiment of FIG. 8 has four transducers arranged in a two-by-two array as can be clearly seen from the pattern of the respective top electrodes TL1, TL2, TL3 and TL4. By comparing the signals from the top electrode TL1 and TL2 with the signals from the top electrode TL3 and TL4, the strain or acceleration in the X-direction can be determined, where comparing the signals from the top electrode TL1 and TL3 with the signals from the top electrode TL2 and TL4 allows to determine the strain or acceleration in the Y-direction.

Figure 9:
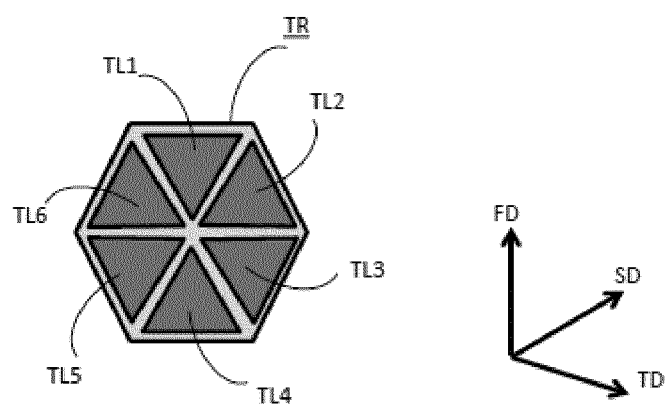
FIG. 9 depicts yet another embodiment of a sensor according to the invention.

FIG. 9 depicts a top view of yet another embodiment of the invention. The configuration is similar to the embodiments of FIG. 7A to 8 in that the transducers forming the single transducer TR are connected to each other via their side surfaces. Where the embodiment in FIGS. 7A and 7B has only two transducers, the embodiment of FIG. 9 has six transducers arranged in a hexagonal configuration as can be clearly seen from the pattern of the respective top electrodes TL1, TL2, TL3, TL4, TL5 and TL6. By comparing the signal from the top electrode TL1 with the signal from the top electrode TL4, the strain or acceleration in the first direction FD can be determined, wherein comparing the signal from the top electrode TL2 with the signal from the top electrode TL5 allows to determine the strain or acceleration in the second direction SD, and wherein comparing the signal from the top electrode TL3 with the signal from the top electrode TL6 allows to determine the strain or acceleration in the third direction TD.

Features described with respect to the embodiment of FIGS. 3-6B may also be applied to the embodiments of FIG. 7A to 9. The advantage of the embodiments of FIG. 7A to 9 is that the occupied space is reduced with respect to the embodiment of FIG. 3-6B as the transducers are attached to each other.

The sensors described above are in use connected to the object. This is preferably done using an adhesive layer in between the bottom plate BP and the object, wherein the adhesive layer is preferably as thin as possible to minimize the impact on the sensor gain as the adhesive layer may also deform due to strain and/or acceleration. The adhesive layer may for instance be a viscous glue such as Epotek, and may for instance be 2 micrometer thick.

As is clear from the text above, the sensor in the invention can be used as an accelerometer for sensing the acceleration or deceleration of an object to which the sensor is attached. Alternatively, the sensor in the invention can be used as a deformation sensor to sense the local deformation of the object to which the sensor is attached. For example, in the context of the lithographic apparatus of FIG. 1, the sensor could be used to sense thermally induced deformation or dynamically induced deformation of the substrate table.

In an embodiment, there is provided a sensor comprising a first shear-mode piezoelectric transducer and a second shear-mode piezoelectric transducer, wherein: each respective one of the first shear-mode piezoelectric transducer and the second shear-mode piezoelectric transducer comprises a respective bottom surface and a respective top surface; the respective top surfaces are rigidly connected to each other; the respective bottom surfaces are configured to be attached to an object to be measured; each respective one of the first shear-mode piezoelectric transducer and the second shear-mode piezoelectric transducer comprises a respective stack of at least two shear-mode piezoelectric subtransducers arranged between the respective top surface and the respective bottom surface; and in each respective stack, adjacent ones of the subtransducers have opposite polarization.

In an embodiment, each respective stack comprises an even number of subtransducers. In an embodiment, the sensor comprises read-out electronics operative to read-out the internal generation of electric charge resulting from shearing of the first shear-mode piezoelectric transducer and the second shear-mode piezoelectric transducer; and the read-out electronics are positioned positioned in between the two piezoelectric transducers. In an embodiment, the respective top surfaces are rigidly connected together by a beam; and in a longitudinal direction of the beam, the beam has a cross-section of a substantially rectangular shape with one or more protrusions or legs extending therefrom for additional stiffness. In an embodiment, the cross-section has a U-shape or an H-shape. In an embodiment, the respective top surfaces are rigidly connected together by a beam made of a material comprising lithium aluminosilicate glass-ceramic. In an embodiment, the first shear-mode piezoelectric transducer has a first side surface; the second shear-mode piezoelectric transducer has a second side surface; and the first side surface and the second side surface face each other and are attached to each other.

In an embodiment, there is provided an object positioning system comprising: an object to be positioned; a measurement system for determining a position of the object in one or more degrees of freedom relative to a reference; an actuator system for positioning the object; a control system configured to drive the actuator system in dependency of an output of the measurement system, wherein the measurement system comprises one or more sensors as described herein.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate; an object positioning system comprising: an object to be positioned; a measurement system for determining a position of the object in one or more degrees of freedom relative to a reference; an actuator system for positioning the object; and a control system configured to drive the actuator system in dependency of an output of the measurement system, the object is one of the support and the substrate table; and the measurement system comprises one or more sensors as described herein.

In an embodiment, there is provided a lithographic apparatus comprising: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the substrate table is provided with a sensor system comprising a sensor as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A sensor system comprising:
   a first shear-mode piezoelectric transducer comprising a stack of at least two shear-mode piezoelectric subtransducers arranged between a top surface of the first shear-mode piezoelectric transducer and a bottom surface of the first shear-mode piezoelectric transducer; and
   a second shear-mode piezoelectric transducer comprising a stack of at least two shear-mode piezoelectric subtransducers arranged between a top surface of the second shear-mode piezoelectric transducer and a bottom surface of the second shear-mode piezoelectric transducer; and
   read-out electronics operative to read-out the internal generation of electric charge resulting from shearing of the first shear-mode piezoelectric transducer and the second shear-mode piezoelectric transducer, the read-out electronics positioned in between the first and second shear-mode piezoelectric transducers,
   wherein:
   the respective top surfaces are rigidly connected to each other;
   the respective bottom surfaces are configured to be attached to an object to be measured; and
   in each respective stack, adjacent ones of the subtransducers have opposite polarization.

2. The sensor system of claim 1, wherein:
   the respective top surfaces are rigidly connected together by a beam; and
   in a longitudinal direction of the beam, the beam has a cross-section of a substantially rectangular shape with one or more protrusions or legs extending therefrom for additional stiffness.

3. The sensor system of to claim 2, wherein the cross-section has a U-shape or an H-shape.

4. The sensor system of claim 2, wherein the respective top surfaces are rigidly connected together by a beam made of a material comprising lithium aluminosilicate glass-ceramic.

5. The sensor system of claim 1, wherein:
   the first shear-mode piezoelectric transducer has a first side surface;
   the second shear-mode piezoelectric transducer has a second side surface; and
   the first side surface and the second side surface face each other and are attached to each other.

6. The sensor system of claim 1, further comprising a temperature sensor attached to a part of the sensor system and the controller is configured to compensate for a temperature change measured by the temperature sensor.

7. The sensor system of claim 1, wherein a structure connecting the respective top surfaces rigidly together has a substantially same coefficient of thermal expansion as a structure to which the respective bottom surfaces are mounted.

8. An object positioning system comprising:
   an object to be positioned;
   a measurement system configured to determine a position of the object in one or more degrees of freedom relative to a reference, the measurement system comprising a sensor system comprising:
   a first shear-mode piezoelectric transducer comprising a stack of at least two shear-mode piezoelectric subtransducers arranged between a top surface of the first shear-mode piezoelectric transducer and a bottom surface of the first shear-mode piezoelectric transducer; and
   a second shear-mode piezoelectric transducer comprising a stack of at least two shear-mode piezoelectric subtransducers arranged between a top surface of the second shear-mode piezoelectric transducer and a bottom surface of the second shear-mode piezoelectric transducer,
   wherein:
   the respective top surfaces are rigidly connected to each other;
   the respective bottom surfaces are configured to be attached to an object to be measured; and
   in each respective stack, adjacent ones of the subtransducers have opposite polarization;
   an actuator system configured to position the object; and
   a control system configured to drive the actuator system based on an output of the measurement system.

9. The object positioning system of claim 8, further comprising read-out electronics operative to read-out the internal generation of electric charge resulting from shearing of the first shear-mode piezoelectric transducer and the second shear-mode piezoelectric transducer, the read-out electronics positioned in between the first and second shear-mode piezoelectric transducers.

10. The object positioning system of claim 8, wherein:
the respective top surfaces are rigidly connected together by a beam; and
in a longitudinal direction of the beam, the beam has a cross-section of a substantially rectangular shape with one or more protrusions or legs extending therefrom for additional stiffness.

11. The object positioning system of claim 10, wherein the cross-section has a U-shape or an H-shape.

12. The object positioning system of claim 10, wherein the respective top surfaces are rigidly connected together by a beam made of a material comprising lithium aluminosilicate glass-ceramic.

13. The object positioning system of claim 8, wherein:
the first shear-mode piezoelectric transducer has a first side surface;
the second shear-mode piezoelectric transducer has a second side surface; and
the first side surface and the second side surface face each other and are attached to each other.

14. The object positioning system of claim 8, further comprising a temperature sensor attached to a part of the sensor system and the controller is configured to compensate for a temperature change measured by the temperature sensor.

15. The object positioning system of claim 8, wherein a structure connecting the respective top surfaces rigidly together has a substantially same coefficient of thermal expansion as a structure to which the respective bottom surfaces are mounted.

16. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate; and
the object positioning system of claim 8
wherein the object is the support or the substrate table.

17. A sensor system comprising:
a first shear-mode piezoelectric transducer comprising a stack of at least two shear-mode piezoelectric subtransducers arranged between a top surface of the first shear-mode piezoelectric transducer and a bottom surface of the first shear-mode piezoelectric transducer; and
a second shear-mode piezoelectric transducer comprising a stack of at least two shear-mode piezoelectric subtransducers arranged between a top surface of the second shear-mode piezoelectric transducer and a bottom surface of the second shear-mode piezoelectric transducer,
wherein:
the respective top surfaces are rigidly connected together by a beam, the beam having, in a longitudinal direction of the beam, a cross-section of a substantially rectangular shape with one or more protrusions or legs extending therefrom for additional stiffness;
the respective bottom surfaces are configured to be attached to an object to be measured; and
in each respective stack, adjacent ones of the subtransducers have opposite polarization.

18. The sensor system of claim 17, wherein the cross-section has a U-shape or an H-shape.

19. The sensor system of claim 17, wherein the respective top surfaces are rigidly connected together by a beam made of a material comprising lithium aluminosilicate glass-ceramic.

20. The sensor system of claim 17, wherein the beam has a substantially same coefficient of thermal expansion as a structure to which the respective bottom surfaces are mounted.

* * * * *